United States Patent
Wu

(10) Patent No.: US 7,701,283 B2
(45) Date of Patent: Apr. 20, 2010

(54) POWER AMPLIFIER WITH NOISE SHAPING

(75) Inventor: Kuo-Hung Wu, Tainen County (TW)

(73) Assignee: Himax Analogic, Inc., Tainan County (TW)

( * ) Notice: Subject to any disclaimer, the term of this patent is extended or adjusted under 35 U.S.C. 154(b) by 63 days.

(21) Appl. No.: 12/055,966

(22) Filed: Mar. 26, 2008

(65) Prior Publication Data

US 2008/0238540 A1   Oct. 2, 2008

(30) Foreign Application Priority Data

Mar. 29, 2007   (TW) .............................. 96110995 A

(51) Int. Cl.
*H03F 3/38* (2006.01)
(52) U.S. Cl. ....................................................... 330/10
(58) Field of Classification Search ................... 330/10, 330/207 A, 251

See application file for complete search history.

(56) References Cited

U.S. PATENT DOCUMENTS 7,463,089 B1 *  12/2008  Bapat et al. ................... 330/10

\* cited by examiner

*Primary Examiner*—Robert Pascal
*Assistant Examiner*—Khiem D Nguyen
(74) *Attorney, Agent, or Firm*—J.C. Patents

(57) ABSTRACT

A power amplifier with noise shaping is disclosed. The power amplifier with noise shaping is able to minimize the noise interference a regular power amplifier encounters. The power amplifier includes a differential-mode integrator, a driving unit, and a low pass filter and integration unit. The differential-mode integrator receives a differential-mode input signal and a differential-mode feedback signal and performs integration operations to output a differential-mode intermediate signal. The driving unit outputs a differential-mode output signal and drives a load according to the differential-mode intermediate signal. The low pass filter and integration unit performs a filtering operation on the differential-mode output signal and integration operations to output the differential-mode feedback signal to the differential-mode integrator.

22 Claims, 5 Drawing Sheets

POWER AMPLIFIER WITH NOISE SHAPING

CROSS-REFERENCE TO RELATED APPLICATION

This application claims the priority benefit of Taiwan application Ser. No. 96110995, filed on Mar. 29, 2007. The entirety of the above-mentioned patent application is hereby incorporated by reference herein and made a part of this specification.

BACKGROUND OF THE INVENTION

1. Field of the Invention

The present invention generally relates to a power amplifier, and more particularly, to a power amplifier with noise shaping.

2. Description of Related Art

FIG. 1 is a circuit block diagram of a conventional audio amplifier. Referring to FIG. 1, a power amplifier, in particular an audio power amplifier, usually adopts a negative feedback to obtain a stable gain. The feedback circuit in the circuit of FIG. 1 employs a voltage regulator 140 composed of an R-R circuit, wherein β is a feedback factor (for example, $\beta \leq 1$). As shown by FIG. 1, a differential-mode input signal pair of VIN and VIP of the integrator 110 takes low voltages as the operation voltages thereof, while the output operation voltage of the power amplifier stage 130 is high voltage. The voltage regulator 140 of FIG. 1 is for converting the high voltages of the power amplifier stage 130 into low voltages (due to $\beta \leq 1$) to be input to the integrator 110 so as to facilitate the circuit running smoothly.

Since an amplifier has been evolved from employing electron tubes to employing transistors, an audio power amplifier has encountered a most challenge problem, the problem of noise interference. Usually, an output power amplifier stage 130 would draw a large current from a power supply terminal VDD, but fail to effectively perform filtering on the power supply terminal VDD; therefore, when a gate signal is triggered and requires the power supply terminal VDD to feed a pure large current in, the large current itself can not satisfy the requirement because the large current contains noise and is not pure. At the point, the noise of the large current would be fed in the whole circuit through the voltage regulator 140. The above-mentioned problem can refer to "Adel S. Sedra & Kenneth C. Smith, *Microelectronic Circuit*, fourth edition, chapter 8, part 2".

Although the circuit of FIG. 1 can utilize the voltage regulator 140 in the feedback circuit thereof to convert the high voltages from the power amplifier stage 130 into low voltages input to the integrator 110, but the output voltage VO (i.e., output voltage VOP and VON) of the power amplifier stage 130 contains high-frequency noise already. Thus, the DC component of the voltage can be reduced in a proportion (for example β=0.4, if the input voltage between the positive terminal and the negative terminal of the voltage regulator 140 is 10 V, then, the output voltage between the positive terminal and the negative terminal of the voltage regulator 140 would be 6 V), but the high-frequency noise thereof is not reduced therewith. In addition, the amount of β affects the total harmonic distortion (THD) of the circuit and THD further affects the strongpoint and weakness of the power amplifier stage, wherein when β is larger, we have a better THD; when β is less, we have a worse THD. In short, not only the problem of THD and noise interference can not be solved, but also the circuit connection between the high-voltage side and the low-voltage side becomes problematic and even the original input audio signal can not be kept.

SUMMARY OF THE INVENTION

Accordingly, the present invention is directed to provide a power amplifier with noise shaping, which is able to effectively reduce the influences of total harmonic distortion (THD) and noise interference on the circuit.

As embodied and broadly described herein, the present invention provides a power amplifier for producing a differential-mode output signal to drive a load according to a received differential-mode input signal. The power amplifier includes a differential-mode integrator, a driving unit and a low pass filter and integration unit. The differential-mode integrator receives a differential-mode input signal and a differential-mode feedback signal and performs an integration operation to output a differential-mode intermediate signal. The driving unit outputs a differential-mode output signal to drive a load according to the differential-mode intermediate signal. The low pass filter and integration unit conducts a filtering operation and an integration operation on the differential-mode output signal to output the differential-mode feedback signal to the differential-mode integrator.

The present invention employs a low pass filter and integration unit instead of a voltage regulator in the conventional circuit. Thus, the circuit of the present invention enhances the robusticity against noise interference and is able to keep the original function of converting high-voltage into low-voltage. As a result, the present invention is able to effectively reduce the influences of THD and noise interference on the circuit and to establish a better circuit connection between the high-voltage side and the low-voltage side thereof.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
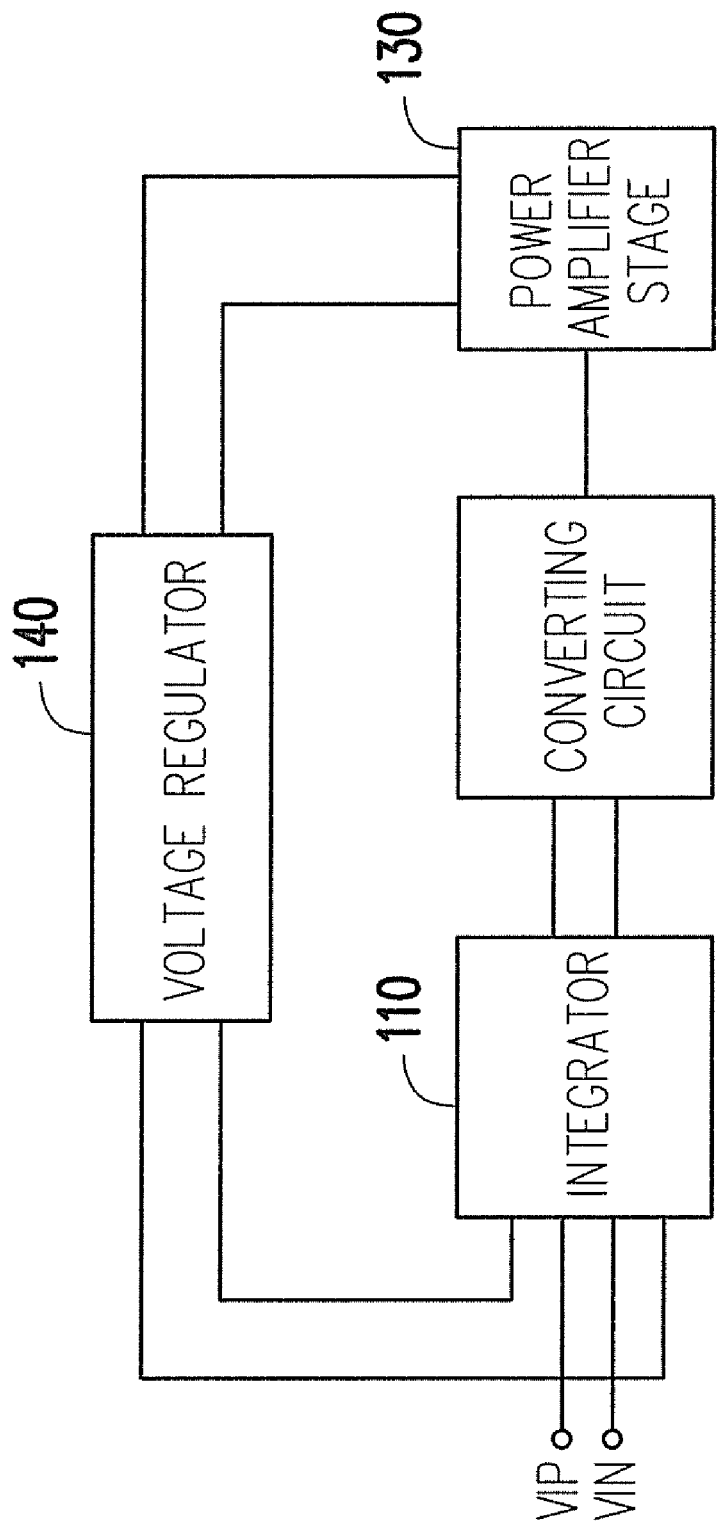
FIG. 1 is a circuit block diagram of a conventional audio amplifier.
Figure 2:
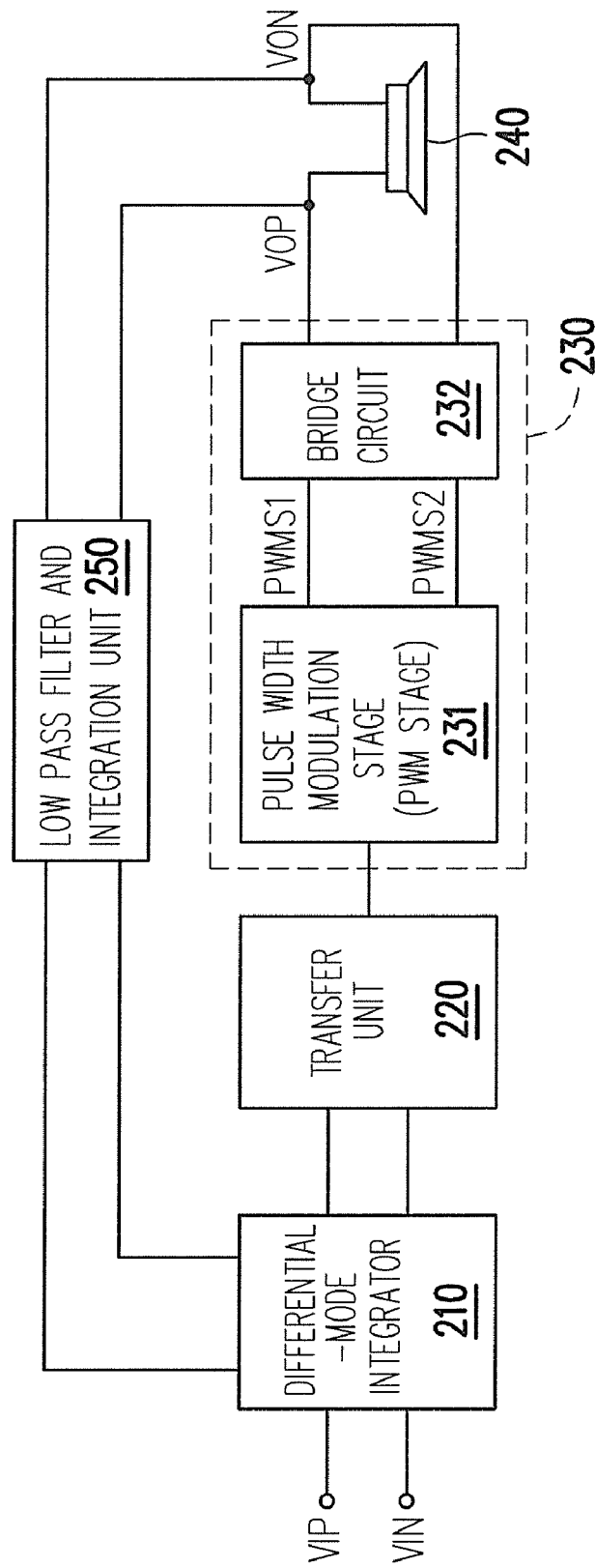
FIGS. 2 and 2A depict a circuit block diagram of a power amplifier with noise shaping according to the embodiment of the present invention.
Figure 2A:
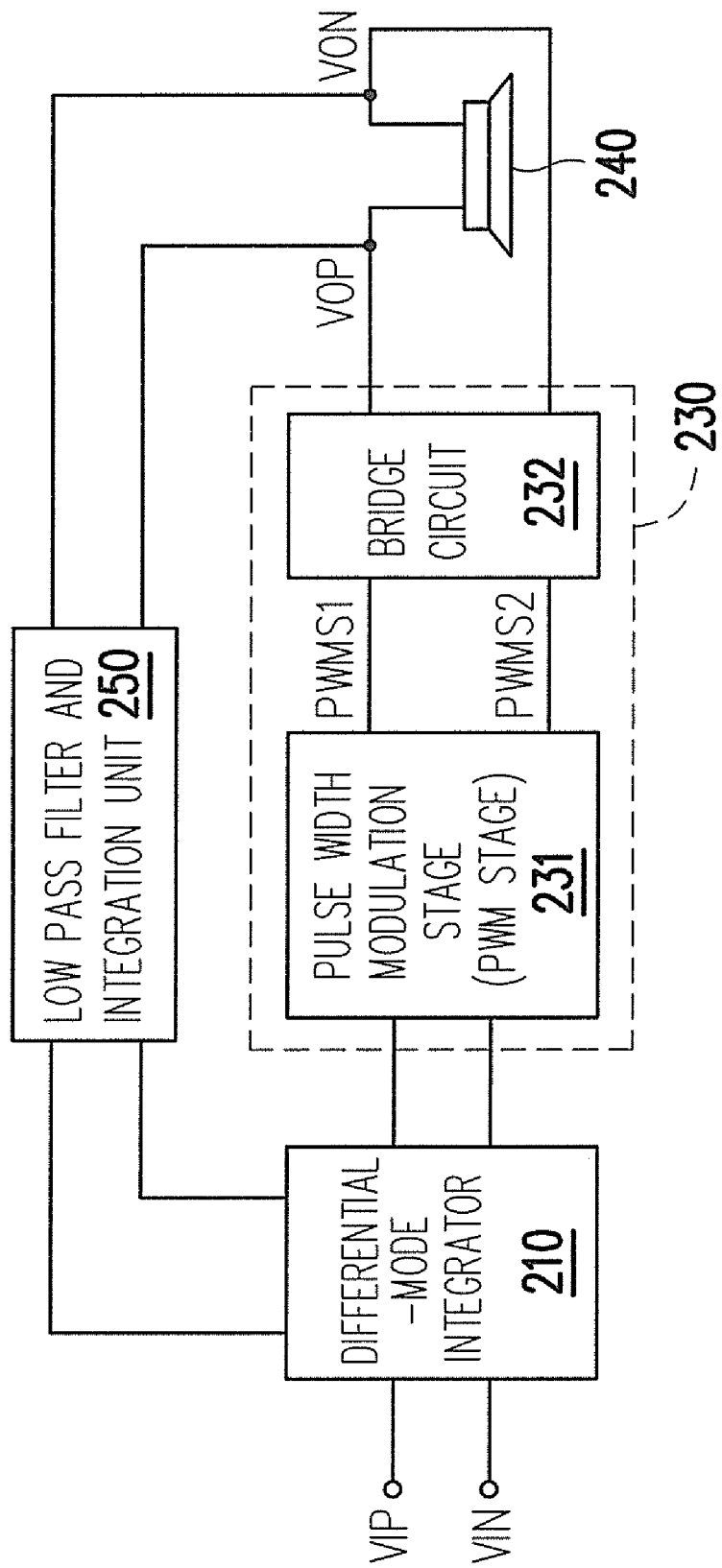

FIG. 2 is a circuit block diagram of a power amplifier with noise shaping according to the embodiment of the present invention. FIG. 2A is a circuit block diagram of a power amplifier with noise shaping according to another embodiment of the present invention.

In the following embodiment, when a component is referred to 'connected to' or 'coupled to' another component, it means the component can be directly connected to or coupled to another component, or there may be a third component located between the component and another the component; on the other hand, when a component is referred to 'directly connected to' or 'directly coupled to' another component, it means there is no third component located therebetween.

It is noted that a class-D audio power amplifier hereinafter is exemplarily taken as an embodiment object of the present invention. However, the present invention is not limited to the class-D audio power amplifier only. Anyone skilled in the art can apply the described embodiment in various power amplifiers, for example, a class-A audio power amplifier, a class-B audio power amplifier or a class-AB audio power amplifier according to the spirit of the present invention.

FIG. 2 is a circuit block diagram of a power amplifier with noise shaping according to the embodiment of the present invention. Referring to FIG. 2, the power amplifier includes a differential-mode integrator 210, a transfer unit 220, a driving unit 230, a load 240 and a low pass filter and integration unit 250. The differential-mode integrator 210 performs integration operations on a received audio signal (i.e. a differential-mode input signal pair VIN and VIP herein) and a differential-mode feedback signal to produce a differential-mode intermediate signal. The driving unit 230 decides an operation state according to the differential-mode intermediate signal produced by the differential-mode integrator 210, and outputs a differential-mode output signal such as signals VON and VOP for driving the load 240. In the present embodiment, the transfer unit 220 is used to transfer the differential-mode intermediate signal into a single-end-mode intermediate signal firstly so as to control the driving unit 230. However, as shown in FIG. 2A, the present invention can make the driving unit 230 directly controlled by the differential-mode intermediate signal without using the transfer unit 220 according to a practical need. The low pass filter and integration unit 250 conducts filtering operations on the differential-mode output signal pair VON and VOP, followed by performing integration operations so as to output a feedback signal to the differential-mode integrator. In the embodiment, the load 240 is a speaker or other loads.

Figure 3:
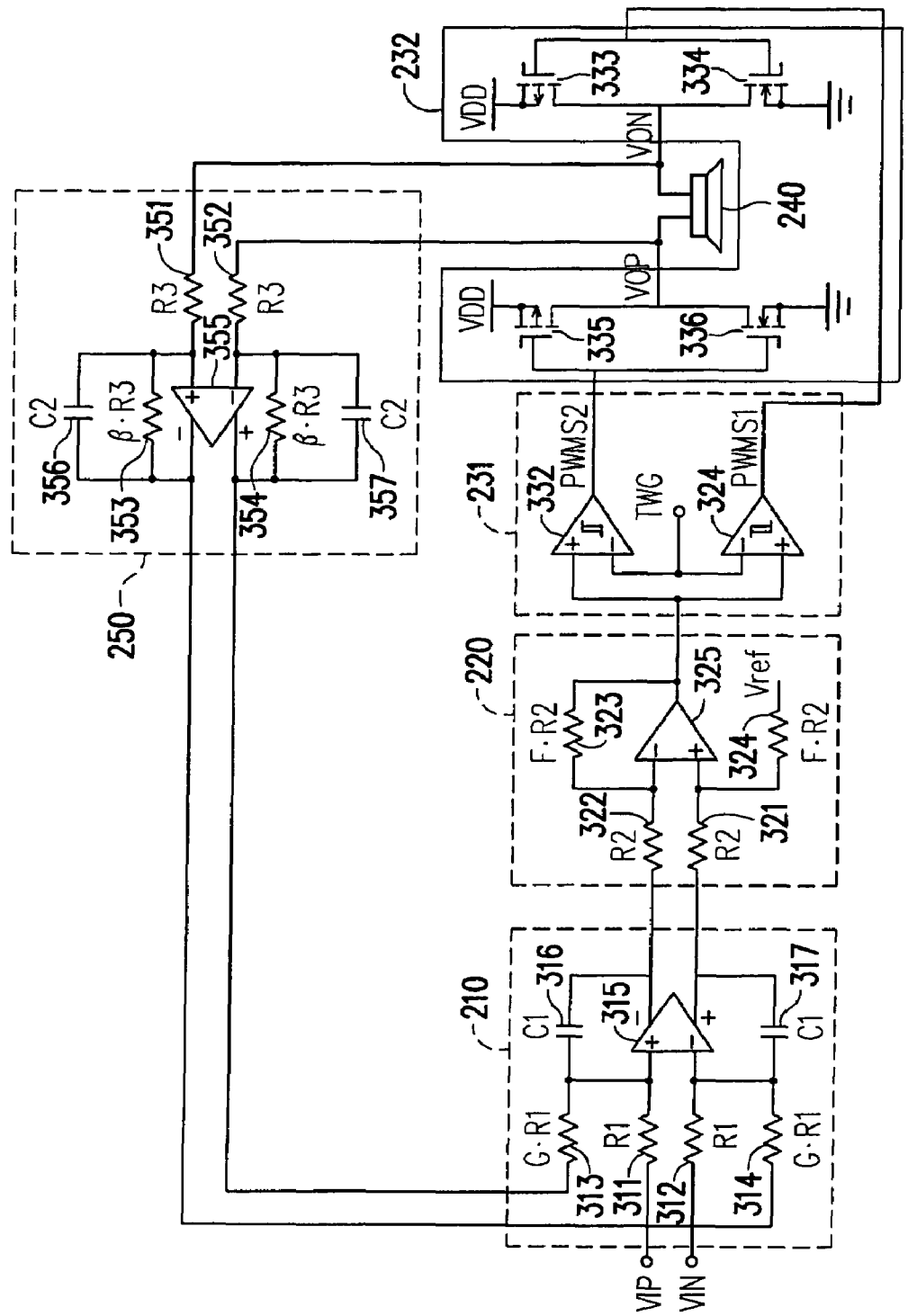
FIG. 3 is a schematic circuit drawing of the power amplifier of FIG. 2.

FIG. 3 is a schematic circuit drawing of the power amplifier of FIG. 2. Referring to FIG. 3, the differential-mode integrator 210 includes a first resistor 311, a second resistor 312, a third resistor 313, a fourth resistor 314, a first operation amplifier 315, a first capacitor 316 and a second capacitor 317. Each of the first ends of the first resistor 311 and the second resistor 312 respectively receives the first end signal VIP and the second end signal VIN of the input signal. Each of the first ends of the third resistor 313 and the fourth resistor 314 respectively receives the first end signal and the second end signal of the differential-mode feedback signal.

The first input terminal (for example, the positive input terminal) of the first operation amplifier 315 is coupled to the second end of the first resistor 311 and the second end of the third resistor 313, while the second input terminal (for example, the negative input terminal) of the first operation amplifier 315 is coupled to the second end of the second resistor 312 and the second end of the fourth resistor 314. The first output terminal (for example, the positive output terminal) and the second output terminal (for example, the negative output terminal) of the first operation amplifier 315 respectively output the first end signal and the second end signal of the differential-mode intermediate signal. The first end and the second end of the first capacitor 316 are respectively coupled to the second output terminal and the first input terminal of the first operation amplifier 315. In this way, an integration circuit with a differential input and a differential output is formed.

Anyone skilled in the art is able to adjust and assign the resistance values of the resistors 311-314 and the capacitance values of the capacitors 316-317 according to the need thereof; that is to say, the impedance match of the circuit is adjustable to control the lowpass bandwidth of the differential-mode integrator 210. In the embodiment, the resistance value of the first resistor 311 and the second resistor 312 is, for example, R1, the resistance value of the third resistor 313 and the fourth resistor 314 is, for example, G×R1 (G and R1 are real numbers), and the capacitance value of the first capacitor 316 and the second capacitor 317 is, for example, C1 (C1 is a real number).

The transfer unit 220 includes a fifth resistor 321, a sixth resistor 322, a seventh resistor 323, an eighth resistor 324 and a second operation amplifier 325. The first end of the fifth resistor 321 is coupled to the first output terminal of the differential-mode integrator 210 for receiving the first end signal of the differential-mode intermediate signal. The first end of the sixth resistor 322 is coupled to the second output terminal of the differential-mode integrator 210 for receiving the second end signal of the differential-mode intermediate signal. The first end of the seventh resistor 323 is coupled to the second end of the sixth resistor 322. The first end of the eighth resistor 324 is coupled to the second end of the fifth resistor 321, while the second end thereof receives a reference voltage Vref. In the embodiment, the level of the above-mentioned reference voltage Vref is, for example, a half of the power voltage VDD of the power amplifier. The first input terminal (for example, the positive input terminal) of the second operation amplifier 325 is coupled to the second end of the fifth resistor 321, the second input terminal (for example, the negative input terminal) thereof is coupled to the second end of the sixth resistor 322 and the output terminal thereof is coupled to the second end of the seventh resistor 323 and outputs a single-end-mode intermediate signal.

Anyone skilled in the art is able to implement the fifth resistor, the sixth resistor, the seventh resistor and the eighth resistor in any means according to the need thereof and to determine the resistances of all the resistors for obtaining a desired circuit characteristic. In the embodiment, the fifth resistor 321 and the sixth resistor 322 take a resistance value of R2 for implementation, while the seventh resistor 323 and the eighth resistor 324 take a resistance value of F×R2 (F is a real number) for implementation.

The driving unit 230 includes a pulse width modulation stage (PWM stage) 231 and a bridge circuit 232. The PWM stage 231 is for producing at least a pulse width modulation signal (a first pulse width modulation signal PWMS1 and a second pulse width modulation signal PWMS2 in the present embodiment), wherein the PWM stage 231 modulates the pulse widths of the pulse width modulation signals (PWM signals) PWMS1 and PWMS2 according to the single-end-mode intermediate signal. The PWM stage 231 includes a first comparator 324 and a second comparator 332. The first input terminal (for example, the positive input terminal) of the first comparator 331 receives the single-end-mode intermediate signal, the second input terminal (for example, the negative input terminal) thereof receives a triangle wave signal TWG and the output terminal thereof outputs the first PWM signal PWMS1. The first input terminal (for example, the positive input terminal) of the second comparator 332 receives the single-end-mode intermediate signal, the second input terminal (for example, the negative input terminal) thereof receives the triangle wave signal TWG and the output terminal thereof outputs the second PWM signal PWMS2.

The bridge circuit 232 of the embodiment is, for example, but not limited by the present invention, a class-D output amplification stage. The bridge circuit 232 includes multiple switches controlled by the PWM signals PWMS1 and PWMS2 (i.e., a first switch 333, a second switch 334, a third switch 335 and a fourth switch 336 in the embodiment). In the bridge circuit 232, the first end of the first switch 333 receives a first voltage (for example, a power voltage VDD), while the second end thereof outputs the first end signal VON of the output signal to the first end of the load 240. The first end of the second switch 334 receives a second voltage (for example, a grounded voltage), while the second end thereof is coupled to the first end of the load 240, wherein the switches 333 and 334 are controlled by the first PWM signal PWMS1.

The first end of the third switch 335 receives the first voltage, while the second end thereof outputs the second end signal VOP of the output signal to the second end of the load 240. The first end of the fourth switch 336 receives the second voltage, while the second end thereof is coupled to the second end of the load 240, wherein the switches 335 and 336 are controlled by the second PWM signal PWMS2.

In the embodiment, the above-mentioned first switch 333 and the third switch 335 are a P-type transistor, the second switch 334 and the fourth switch 336 are an N-type transistor and the four transistors form a class-D output amplification stage. The PWM stage 231 uses the pulse widths and the phases of the PWM signals PWMS1 and PWMS2 to control the switches 333-336 of the bridge circuit. In this way, the driving unit 230 is able to output an audio signal (i.e., the output signal pair VON and VOP) according to the single-end-mode intermediate signal to drive the load 240. In the embodiment, the first voltage is the power voltage VDD which means the voltage for driving the output amplification stage and is not limited by the power voltage of the whole circuit, while the second voltage also has a voltage reference level and is not limited by the grounded voltage.

The low pass filter and integration unit 250 includes a ninth resistor 351, a tenth resistor 352, a third operation amplifier 355, an eleventh resistor 353, a twelfth resistor 354, a third capacitor 356 and a fourth capacitor 357. The first ends of the ninth resistor 351 and the tenth resistor 352 respectively receive the first end signal VON and the second end signal VOP of the differential-mode output signal. The first input terminal (for example, the positive input terminal) of the third operation amplifier 355 is coupled to the second end of the ninth resistor 351, while the second input terminal (for example, the negative input terminal) thereof is coupled to the second end of the tenth resistor 352. The first output terminal (for example, the positive output terminal) and the second output terminal (for example, the negative output terminal) of the third operation amplifier 355 respectively output the first end signal and the second end signal of the differential-mode feedback signal to the differential-mode integrator 210.

The first end and the second end of the eleventh resistor 353 are respectively coupled to the second output terminal and the first input terminal of the third operation amplifier 355. The first end and the second end of the twelfth resistor 354 are respectively coupled to the first output terminal and the second input terminal of the third operation amplifier 355. The first end and the second end of the third capacitor 356 are respectively coupled to the second output terminal and the first input terminal of the third operation amplifier 355. The first end and the second end of the fourth capacitor 357 are respectively coupled to the first output terminal and the second input terminal of the third operation amplifier 355.

Anyone skilled in the art is able to adjust and assign the resistance values of the resistors 351-354 and the capacitance values of the capacitors 356-357 according to the need thereof; that is to say, the impedance match of the circuit is adjustable to control the lowpass bandwidth of the low pass filter and integration unit 250. In the embodiment, the resistance value of the ninth resistor 351 and the tenth resistor 352 is, for example, R3, the resistance value of the eleventh resistor 353 and the twelfth resistor 354 is, for example, $\beta \times R3$ ($\beta$ is a real number), and the capacitance value of the third capacitor 356 and the fourth capacitor 357 is, for example, C2.

Figure 4:
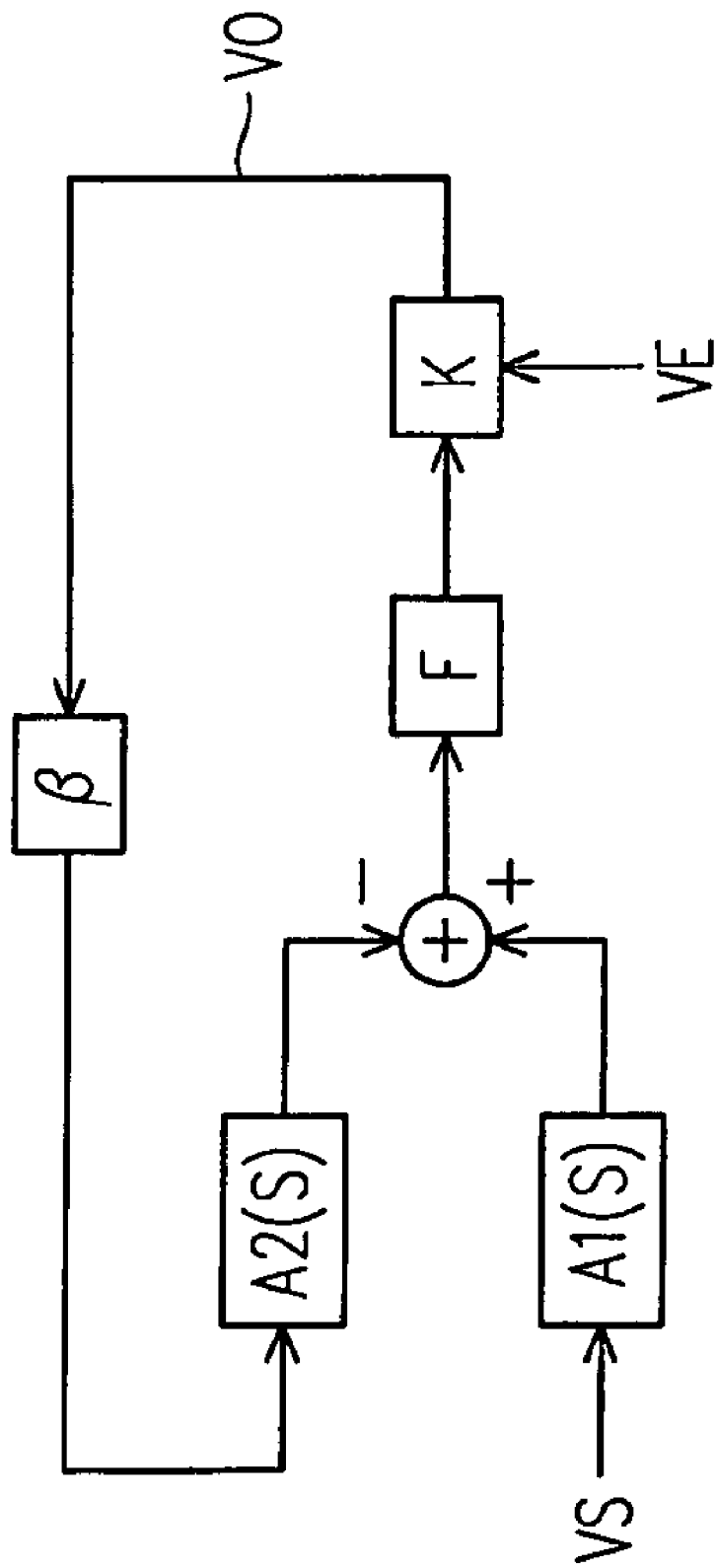
FIG. 4 is a signal flowchart of the power amplifier of FIG. 3.

FIG. 4 is a transfer function block diagram of the power amplifier of FIG. 3. Referring to FIG. 4, the output signal VO can be deducted from the transfer function block diagram that $VO=[1KA1(s)/(1+K\beta A2(s))]\times VS+[K/(1+K\beta A2(s))]\times VE$, wherein $VO=VOP-VON$, $VS=VIN-VIP$, $A1(s)=-1/SCR$, $A2(s)=-1/SGCR=A1(s)/G$, VE is noise (THD+noise), and $S=j\omega=j2\pi f$, f is frequency. If VIN is disregarded, the relationship between the voltage and the high-frequency noise can be deducted that $VO=[K/(1+K\beta A2(s))]\times VE$; further defining $K\beta A2(s)\gg 1$, we have $VO\approx VE/\beta A2(s)$. Thus, the ratio of the output signal over the noise is $VO/VE\approx 1/\beta A2(s)$. However, the greater $\beta A2(s)$, the value of the noise VE is the less and the noise contained by the output signal VO is decreased, which effectively lowers the noise component in the circuit.

In the above-described circuit of FIG. 3, the low pass filter and integration unit 250 of the feedback circuit is implemented by a lowpass filter, which is not only to sustain the original audio source signal and adjust the voltage of the output terminal based on the amount of the feedback factor, but also to filer out unnecessary high-frequency noise. In comparison with the prior art where the feedback circuit employs a voltage regulator, thus, the prior art is able to change the voltage amount only, but is unable to filter out the high-frequency noise component. It can be seen therefrom that the circuit of the embodiment of the present invention is able to not only reduce the noise component contained by the voltage, but also to establish a better connection between the high-voltage side and the low-voltage side of the circuit.

In summary, the present invention employs a low pass filter and integration unit instead of the voltage regulator in the conventional circuit, which is able to reduce THD and noise interference in the feedback circuit of the present invention circuit and to keep the original function of the conventional circuit that a high-voltage is converted into a low-voltage for the low-voltage side to use. Therefore, the present invention is able to not only effectively reduce the influences of THD and noise interference on the circuit, but also to establish a better connection between the high-voltage side and the low-voltage side of the circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power amplifier for generating a differential-mode output signal to drive a load according to the received differential-mode input signal; the power amplifier comprising:
    a differential-mode integrator for receiving the differential-mode input signal and a differential-mode feedback signal and performing integration operations to output a differential-mode intermediate signal;
    a driving unit for outputting the differential-mode output signal to drive the load under control of the differential-mode intermediate signal from the differential-mode integrator; and
    a low pass filter and integration unit for filtering the differential-mode output signal and performing integration operations to output the differential-mode feedback signal to the differential-mode integrator.

2. The power amplifier according to claim 1, wherein the differential-mode integrator comprises:

a first resistor, comprising a first end for receiving the first end signal of the differential-mode input signal;

a second resistor, comprising a first end for receiving the second end signal of the differential-mode input signal;

a third resistor, comprising a first end for receiving the first end signal of the differential-mode feedback signal;

a fourth resistor, comprising a first end for receiving the second end signal of the differential-mode feedback signal;

a first operation amplifier, comprising a first input terminal coupled to the second end of the first resistor and the second end of the third resistor and a second input terminal coupled to the second end of the second resistor and the second end of the fourth resistor, wherein the first output terminal and the second output terminal of the first operation amplifier respectively output the first end signal and the second end signal of the differential-mode intermediate signal;

a first capacitor, comprising a first end and a second end respectively coupled to the second output terminal and the first input terminal of the first operation amplifier; and a second capacitor, comprising a first end and a second end respectively coupled to the first output terminal and the second input terminal of the first operation amplifier.

3. The power amplifier according to claim 2, wherein the resistance values of the first resistor and the second resistor are the same as each other.

4. The power amplifier according to claim 2, wherein the resistance values of the third resistor and the fourth resistor are the same as each other.

5. The power amplifier according to claim 2, wherein the capacitance values of the first capacitor and the second capacitor are the same as each other.

6. The power amplifier according to claim 1, further comprising a transfer unit for transferring the differential-mode intermediate signal into a single-end-mode intermediate signal, wherein the single-end-mode intermediate signal is received by the driving unit.

7. The power amplifier according to claim 6, wherein the transfer unit comprises:

a fifth resistor, comprising a first end for receiving the first end signal of the differential-mode intermediate signal;

a sixth resistor, comprising a first end for receiving the second end signal of the differential-mode intermediate signal;

a seventh resistor, comprising a first end coupled to the second end of the sixth resistor;

an eighth resistor, comprising a first end coupled to the second end of the fifth resistor and a second end for receiving a reference voltage; and a second operation amplifier, comprising a first input terminal coupled to the second end of the fifth resistor, a second input terminal coupled to the second end of the sixth resistor, and an output terminal coupled to the second end of the seventh resistor, wherein the output terminal of the second operation amplifier outputs the single-end-mode intermediate signal.

8. The power amplifier according to claim 7, wherein the resistance values of the fifth resistor and the sixth resistor are the same as each other.

9. The power amplifier according to claim 7, wherein the resistance values of the seventh resistor and the eighth resistor are the same as each other.

10. The power amplifier according to claim 7, wherein the level of the reference voltage is a half of the power voltage level.

11. The power amplifier according to claim 6, wherein the driving unit comprises:

a pulse width modulation (PWM) stage for producing at least a PWM signal, wherein the PWM stage modulates the pulse width of the PWM signal according to a single-end-mode intermediate signal; and a bridge circuit, having multiple switches controlled by the PWM signal.

12. The power amplifier according to claim 11, wherein the PWM stage produces a first PWM signal and a second PWM signal and modulates the pulse widths of the first PWM signal and the second PWM signal according to the single-end-mode intermediate signal.

13. The power amplifier according to claim 12, wherein the PWM stage comprises:

a first comparator, comprising a first input terminal for receiving the single-end-mode intermediate signal, a second input terminal for receiving a triangle wave signal and an output terminal for outputting the first PWM signal; and a second comparator, comprising a first input terminal for receiving the single-end-mode intermediate signal, a second input terminal for receiving the triangle wave signal and an output terminal for outputting the second PWM signal.

14. The power amplifier according to claim 12, wherein the bridge circuit comprises:

a first switch, comprising a first end for receiving a first voltage and a second end coupled to the first end of the load, wherein the first switch is controlled by the first PWM signal;

a second switch, comprising a first end for receiving a second voltage and a second end coupled to the first end of the load, wherein the second switch is controlled by the first PWM signal;

a third switch, comprising a first end for receiving the first voltage and a second end coupled to the second end of the load, wherein the third switch is controlled by the second PWM signal; and a fourth switch, comprising a first end for receiving the second voltage and a second end coupled to the second end of the load, wherein the fourth switch is controlled by the second PWM signal.

15. The power amplifier according to claim 14, wherein the first switch and the third switch are P-type transistors, while the second switch and the fourth switch are N-type transistors.

16. The power amplifier according to claim 14, wherein the first voltage is a power voltage and the second voltage is a grounded voltage.

17. The power amplifier according to claim 1, wherein the low pass filter and integration unit comprises:

a ninth resistor, comprising a first end for receiving the first end signal of the differential-mode output signal;

a tenth resistor, comprising a first end for receiving the second end signal of the differential-mode output signal;

a third operational amplifier, comprising a first input terminal coupled to the second end of the ninth resistor, a second input terminal coupled to the second end of the tenth resistor, and a first and second output terminals of the third operational amplifier respectively output the first end signal and the second end signal of the differential-mode feedback signal;

an eleventh resistor, comprising a first end and a second end respectively coupled to the second output terminal and the first input terminal of the third operational amplifier;

a twelfth resistor, comprising a first end and a second end respectively coupled to the first output terminal and the second input terminal of the third operational amplifier;

a third capacitor, comprising a first end and a second end respectively coupled to the second output terminal and the first input terminal of the third operational amplifier; and a fourth capacitor, comprising a first end and a second end respectively coupled to the first output terminal and the second input terminal of the third operational amplifier.

18. The power amplifier according to claim 17, wherein the resistance values of the ninth resistor and the tenth resistor are the same as each other.

19. The power amplifier according to claim 17, wherein the resistance values of the eleventh resistor and the twelfth resistor are the same as each other.

20. The power amplifier according to claim 17, wherein the capacitance values of the third capacitor and the fourth capacitor are the same as each other.

21. The power amplifier according to claim 1, wherein the differential-mode input signal is an audio signal.

22. The power amplifier according to claim 1, wherein the load comprises a speaker.

* * * * *